United States Patent
Nishiyama et al.

(10) Patent No.: US 9,784,809 B2
(45) Date of Patent: Oct. 10, 2017

(54) METHOD FOR NMR MEASUREMENTS ON QUADRUPOLAR NUCLEI

(71) Applicant: JEOL Ltd., Tokyo (JP)

(72) Inventors: Yusuke Nishiyama, Tokyo (JP); Takahiro Nemoto, Tokyo (JP)

(73) Assignee: JEOL Ltd., Tokyo (JP)

(*) Notice: Subject to any disclaimer, the term of this patent is extended or adjusted under 35 U.S.C. 154(b) by 1183 days.

(21) Appl. No.: 13/860,041

(22) Filed: Apr. 10, 2013

(65) Prior Publication Data
US 2013/0271138 A1    Oct. 17, 2013

(30) Foreign Application Priority Data
Apr. 13, 2012   (JP) .................................. 2012-091551

(51) Int. Cl.
*G01R 33/44*   (2006.01)
*G01R 33/46*   (2006.01)

(52) U.S. Cl.
CPC ....... *G01R 33/441* (2013.01); *G01R 33/4608* (2013.01); *G01R 33/4633* (2013.01)

(58) Field of Classification Search
USPC .......................... 324/300–322; 600/407–435; 382/128–131
See application file for complete search history.

(56) References Cited

U.S. PATENT DOCUMENTS

| | | | | |
|---|---|---|---|---|
| 7,276,903 B2* | 10/2007 | Lupulescu | ......... | G01R 33/4641 324/307 |
| 8,283,922 B2* | 10/2012 | Tekely | ................ | G01R 33/307 324/307 |
| 8,963,546 B2* | 2/2015 | Ulzega | ............... | G01R 33/4641 324/309 |
| 2007/0013373 A1* | 1/2007 | Lupulescu | ......... | G01R 33/4641 324/307 |
| 2010/0052673 A1* | 3/2010 | Tekely | ............... | G01R 33/4641 324/307 |
| 2012/0229137 A1* | 9/2012 | Ulzega | ............... | G01R 33/4641 324/309 |
| 2013/0271138 A1* | 10/2013 | Nishiyama | ........... | G01R 33/441 324/314 |

OTHER PUBLICATIONS

Nishiyama et al., "Proton-nitrogen-14 overtone two-dimensional correlation NMR spectroscopy of solid-sample at very fast magic angle sample spinning", Journal of Magnetic Resonance, 2013, pp. 160-164, vol. 230.

(Continued)

*Primary Examiner* — Melissa Koval
*Assistant Examiner* — Tiffany Fetzner
(74) *Attorney, Agent, or Firm* — The Webb Law Firm

(57) ABSTRACT

A method is offered which permits NMR measurements of integer spin nuclei to be performed at higher sensitivity than heretofore. In particular, the method enables high-resolution multidimensional correlation NMR measurements on integer spin nucleus S having integer spin S and nucleus I of other spin species. The method starts with applying an RF magnetic field having a frequency that is n times (where n is an integer equal to or greater than 2) the Larmor frequency of the integer spin nucleus S to the spin S. Magnetization transfer is effected between the nucleus I and the integer spin nucleus S.

11 Claims, 11 Drawing Sheets

(56) References Cited

OTHER PUBLICATIONS

Ramanathan et al., "High-Resolution Solid-State 13C-14N and 13C-15N Heteronuclear Correlation Spectroscopy", Journal of Magnetic Resonance, 1990, pp. 227-235, vol. 86.

Jayanthi et al., "Excitation and correlation of 14N overtone transitions and measurement of heteronuclear dipolar coupling using DAPT", Chemical Physics Letters, 2011, pp. 121-125, vol. 502.

McNamara et al., "Direct Observation of Asymmetric 1H/14N Triplets and Applications of Asymmetric Dipole-Dipole Splittings to Structure Determination by Solid-State NMR Spectroscopy", J. Am. Chem. Soc., 1995, pp. 7805-7811, vol. 117.

Garroway et al., "Demonstration of Indirect Detection of 14N delta-M=2 (Overtone) NMR Transitions", Journal of Magnetic Resonance, 1989, pp. 591-596, vol. 82.

Nishiyama et al., "Very fast magic angle spinning 1H-14N 2D solid-state NMR: Sub-micro-liter sample data collection in a few minutes", Journal of Magnetic Resonance, 2011, pp. 44-48, vol. 208.

S. Cavadini et al., "Nitrogen-14 NMR Spectroscopy Using Residual Dipolar Splittings in Solids", Journal of the American Chemical Society, 2006, pp. 7706-7707, 128.

Z. Gan, "Measuring Amide Nitrogen Quadrupolar Coupling by High-Resolution 14N/13C NMR Correlation under Magic-Angle Spinning", Journal of the American Chemical Society, 2006, pp. 6040-6041, 128.

Z. Gan et al., "Proton-detected 14N MAS NMR using homonuclear decoupled rotary resonance", Chemical Physics Letters, 2007, pp. 163-169, 435.

Cavadini et al., "Cohorence transfer between spy nuclei and nitrogen-14 in solids", Journal of Magnetic Resonance, 2008, pp. 160-164, 190.

R. Tycko et al., "Overtone NMR spectroscopy", Journal of Chemical Physics, Feb. 15, 1987, pp. 1761-1774, 86 (4).

L.A. O'Dell et al., "14N magic angle spinning overtone NMR spectra", Chemical Physics Letters, 2011, pp. 168-173, 514.

\* cited by examiner

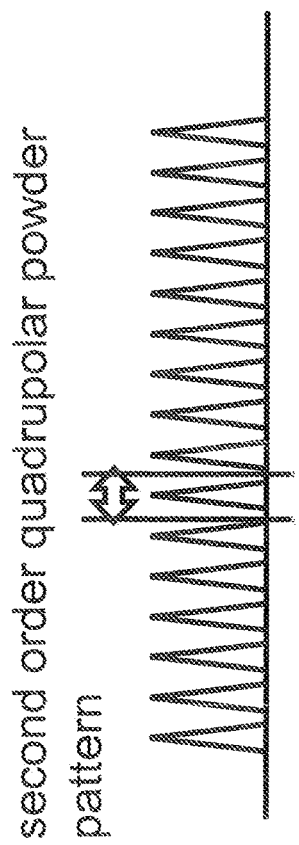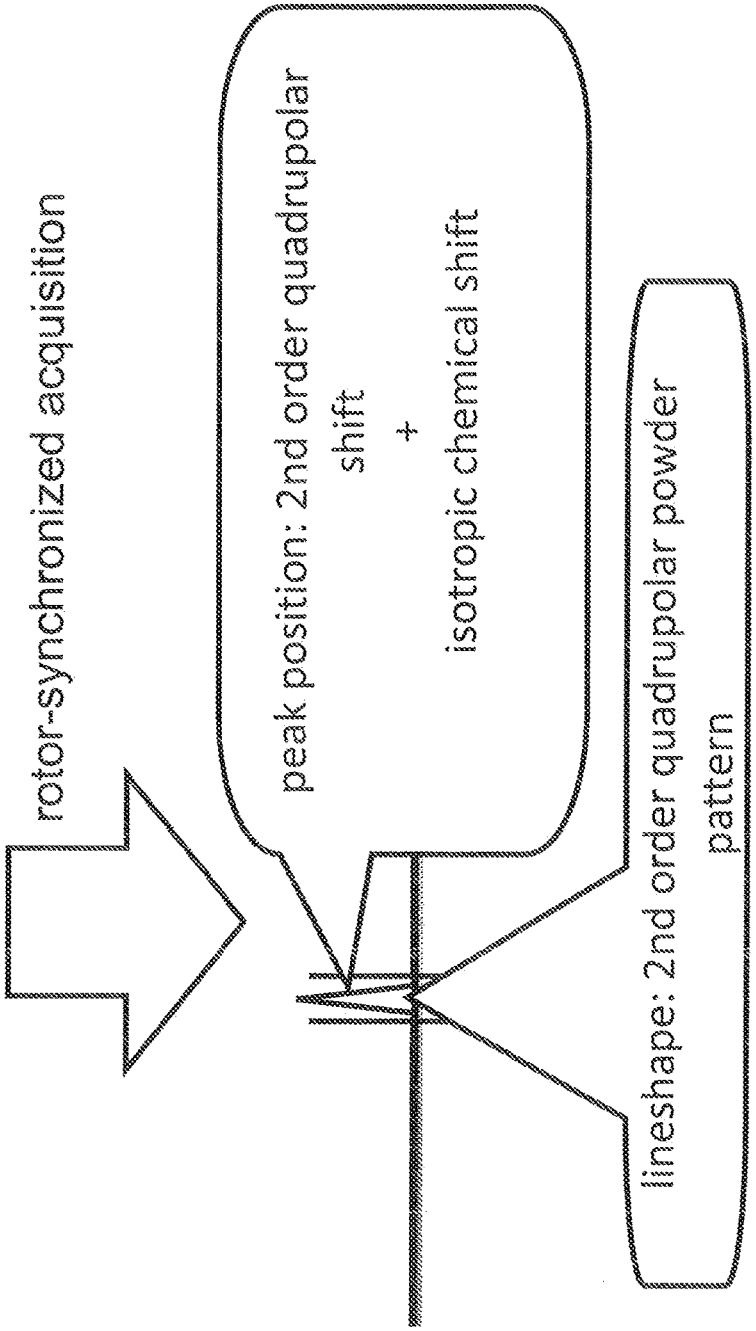
FIG. 5

METHOD FOR NMR MEASUREMENTS ON QUADRUPOLAR NUCLEI

BACKGROUND OF THE INVENTION

Field of the Invention

The present invention relates to a method of making measurements on quadrupolar nuclei which can be observed by NMR spectroscopy.

Description of Related Art

A nuclear magnetic resonance (NMR) spectrometer is an analytical instrument for detecting signals of atomic nuclei having spin magnetic moments by applying a static magnetic field to these atomic nuclei to induce a Larmor precession in the spin magnetic moments and irradiating the atomic nuclei with RF waves having the same frequency as the Larmor precession so as to produce a resonance.

There are 120 nuclear species, in total, that can be observed by NMR spectroscopy, i.e., nuclear species having nuclear spins. A number of integer spin nuclei are included among them. Important nuclear species such as $^{14}N$ nucleus are included among them. First, the resolution of integer spin S is described.

An integer spin S has two features. One is that there exist quadrupolar interactions which are present in nuclear spins with $I > \frac{1}{2}$. Quadrupolar interactions are always present in integer spins S with $I > \frac{1}{2}$.

Such quadrupolar interactions might be quite large, and some of them exceed tens of MHz or more. Furthermore, the degree of broadening of a spectrum due to a quadrupolar interaction varies depending on the relative orientation between spin and magnetic field. Therefore, in a powdered sample, there are quadrupolar interactions of various magnitudes.

Another feature of integer spin S is that every single quantum transition is affected by first-order quadrupolar interactions. In normal NMR measurements, single quantum transitions are observed and so it can also be said that normal NMR measurements of integer spins S are affected by first-order quadrupolar interactions. That is, in an NMR spectrum of integer spins S, resonance spins appear at positions reflecting the magnitudes of quadrupolar interactions.

Accordingly, in a spectrum of a powdered sample with integer spin S, resonance lines appear at various positions reflecting the distribution of the sample orientation, leading to spectral broadening. Taking $^{14}N$ nucleus with spin $S=1$ as an example, the effects of quadrupolar interactions are described below by referring to FIG. 1.

If energy splitting is only Zeeman splitting, and if an NMR measurement is made, a single sharp peak appears at position $v_L$. However, in the case of integer spin S, energy levels of $\pm 1$ vary due to first-order quadrupolar interactions. As a result, two sharp split peaks appear at positions $v_L \pm v_Q$.

In the case of powdered sample, the values of $v_Q$ are distributed due to the spin orientation. Peaks appear at various positions and overlap each other, producing a broad signal. This broad signal is referred to as a first-order quadrupolar powder pattern. In the case of $^{14}N$ nucleus, quadrupolar interactions typically have magnitudes on the order of MHz. Corresponding first-order powder patterns exhibit linewidths on the order of MHz.

In this way, an NMR spectrum of integer spin S is affected by quadrupolar interactions. This gives rise to broadening of signal. Furthermore, quadrupolar interactions are quite large and, therefore, second-order quadrupolar broadening corresponding to second-order perturbation terms also takes place. Second-order quadrupolar interactions are also included in the energy levels of FIG. 2. Where up to second-order terms are taken into consideration, an NMR signal produces peaks at positions $v_L \pm v_Q^{(1)} + v_Q^{(2)}$.

Both of $v_Q^{(1)}$ and $v_Q^{(2)}$ vary due to relative orientation between spins and magnetic field. In the case of a powdered sample, therefore, an NMR signal is observed as a superposition of first-order and second-order powder patterns. Second-order broadening is vastly smaller than first-order broadening.

The following methods are available to remove broadening.

Related Art 1: Magic-Angle Sample Spinning (MAS)

Application of a pulsed RF magnetic field having a frequency close to the Larmor frequency of integer spin S permits excitation and observation of single quantum transitions. Furthermore, the first-order pattern of integer spin S can be averaged by applying magic-angle sample spinning (MAS) to the sample. MAS is a technique for spinning a sample at high speed about an axis tilted by a magic angle relative to a magnetic field, and is often used in solid sample NMR techniques.

The obtained NMR spectrum is observed to be split into a group of spinning sidebands (SSBs) in a comb-like form (see FIG. 3). The individual peaks are somewhat more sharpened by MAS even in the case of second-order powder patterns and thus are high-resolution peaks. Second-order powder patterns remain but their magnitudes are extremely smaller than first-order powder patterns. Therefore, an overwhelmingly great increase in resolution is achieved. One problem is that there are quite many SSBs. That is, the signal intensity is dispersed and the sensitivity is low. Another problem is that if any slight deviation from the magic angle occurs, powder patterns are erased incompletely to thereby produce broadening, because first-order quadrupolar powder patterns are deleted by MAS.

Related Art 2: SQ-HMQC, SQ-HSQC under MAS

As described already in connection with related art 1, first-order quadrupolar broadening is eliminated by MAS and high-resolution measurements of NMR signals of integer spins S are enabled. However, there is the problem that the signal is split into a large number of SSBs, leading to a decrease in sensitivity.

Accordingly, a technique also employing indirect measurements using other nuclear species has been proposed. In particular, a spectrum of integer spin S is placed in an indirect observation dimension. Observations are made indirectly through spin I. Since single quantum transitions are selected for the integer spin S, the spectrum in the indirect observation dimension is quite close to spectra obtained by the related art 1.

One example of integer spin S indirectly observed is illustrated in FIG. 4, where $^{14}N$ nucleus with $I=1$ is taken as one example and $I=\frac{1}{2}$ is directly observed. The sample is measured under MAS. The measurement is similar to the HMQC technique except that the indirect observation dimension ($t_1$-dimension) is synchronized with the sample spinning period. That is, the period of the $t_1$-dimension is set to be an integral multiple of the sample spinning period $\tau_r$, i.e., $t_1 = n\tau_r$.

This technique is published in S. Cavadini et al., Journal of the American Chemical Society 128 (2006) 7706 and Z. Gan, Journal of the American Chemical Society 128 (2006) 6040 and constitutes U.S. Pat. No. 7,276,903. Pulses applied to integer spin S have a frequency close to the Larmor frequency of integer spin S. This technique has three features:

(1) Since the process is started from initial magnetization of a nucleus with I=½ that is greater than the initial magnetization of $^{14}N$ nucleus, the NMR detection sensitivity is enhanced.

(2) Since the nucleus with I=½ of higher sensitivity (higher Larmor frequency) than $^{14}N$ nucleus in the $t_2$-dimension is observed, the NMR detection sensitivity is improved.

(3) Since the dimension of $^{14}N$ nucleus (indirect measurement dimension: $t_1$-dimension) is synchronized with the sample spinning period, all SSBs of $^{14}N$ nucleus are observed to be overlapped at the center, thus improving the NMR detection sensitivity.

FIG. 5 illustrates the feature (3) above. Because a signal split into numerous SSBs is superimposed in a central peak, the NMR detection sensitivity is improved. As a result, first-order quadrupolar broadening is removed from the resulting NMR spectrum of $^{14}N$ nucleus in the indirectly observed dimension and the effects of second-order quadrupoles remain.

Peak positions are determined by second-order quadrupolar shift and isotropic chemical shift, and the lineshape is determined by second-order quadrupolar powder pattern. In addition, it is known that third-order quadrupolar powder pattern affects the lineshape.

At first, magnetization transfer between spins I and S was effected by heteronuclear J coupling and heteronuclear residual dipolar splitting (RDS). Later, a method using heteronuclear dipolar coupling was also proposed (see Z. Gan et al., Chemical Physics Letters 435 (2007) 163).

As a modification of this technique, heteronuclear single quantum coherence (HSQC) for bisecting a 180-degree pulse at the center of spin I is also proposed as shown in FIG. 6 (see S. Cavadini et al., Journal of Magnetic Resonance 190 (2008) 160-164).

These techniques succeeded as high-sensitivity, high-resolution correlation NMR methods. However, there is the problem that measurements are quite sensitive to adjustment of the magic angle and that experimental adjustments are quite difficult to make. In this technique, first-order quadrupolar interactions are eliminated by MAS. Accordingly, only a slight deviation from the magic angle results in incomplete removal of first-order dipolar interactions. In particular, it is reported that even a deviation of 1/100 degree distorts the spectrum.

Related Art 3: DQ-HMQC and DQ-HSQC

A double-quantum (DQ) method has been proposed as a technique of solving the problem with adjustment of the magic angle, i.e., the problem with SQ (single quantum)-HMQC/HSQC methods. This method employs double quantum transitions in order to remove first-order quadrupolar interactions (see S. Cavadini et al., Journal of the American Chemical Society 128 (2006) 7706 and Z. Gan, Journal of the American Chemical Society 128 (2006) 6040).

Energy levels are shown in FIG. 7, where $^{14}N$ nucleus with S=1 is taken as one example. Single quantum transitions include first-order quadrupolar interactions. On the other hand, double quantum transitions do not include first-order quadrupolar interactions. That is, if double quantum transitions can be observed, it is possible to eliminate first-order quadrupolar interactions.

Since the elimination of first-order quadrupolar interactions does not rely on MAS, a slight deviation from the magic angle does not greatly affect the spectrum. Because third-order quadrupolar interactions are simultaneously removed, the lineshape is determined only by second-order quadrupolar powder pattern.

No spinning sidebands appear and so the restriction $t_1=n\tau_r$ is not imposed, unlike in SQ-HMQC/HSQC where the restriction is placed to superimpose spinning sidebands. That is, there is the advantage that no restrictions are imposed on the spectral width in the directly observed dimension but rather the width can be set at will.

DQ-HMQC/HSQC is observed with the same pulse sequence as for SQ-HMQC/HSQC. However, phase rotation is effected to select double quantum transitions of $^{14}N$ nucleus in the $t_1$-dimension. The double quantum transitions of $^{14}N$ nucleus are caused by excitation near the Larmor frequency of $^{14}N$ nucleus. DQ-HMQC/HSQC is not sensitive to the setting of the magic angle but permits NMR measurements to be made easily. However, there is the disadvantage that the sensitivity is low because of low double quantum excitation efficiency.

Related Art 4: Overtone NMR Spectroscopy

A method using RF pulses having a frequency that is double the Larmor frequency in order to directly excite double quantum transitions of integer spins has been proposed. This method is known as overtone NMR spectroscopy, and permits direct excitations and direct observation of double quantum transitions.

In recent years, it has been shown that overtone NMR spectroscopy can be performed under MAS. Although overtone NMR spectroscopy enables high-resolution measurements, high-sensitivity measurements cannot be always made because of low overtone excitations and detection efficiencies (see R. Tycko et al., Journal of Chemical Physics 86 (1987) 1761 and L. A. O'Dell et al., Chemical Physics Letters 514 (2011) 168).

As described so far, the four related art methods have the following problems. Related art method 1 (magic angle sample spinning) suffers from low sensitivity because a signal is split into numerous sample spinning sidebands. This method is sensitive to the magic angle. Any slight deviation leads to a deterioration in resolution. Related art method 2 (SQ-HMQC, SQ-HSQE under MAS) is sensitive to the magic angle. Any slight deviation leads to a deterioration in resolution. Related art method 3 (DQ-HMQC, DQ-HSQC) suffers from low sensitivity because of low double quantum excitation efficiencies. Related art method 4 (overtone NMR spectroscopy) suffers from low sensitivity because of low overtone excitations and low detection efficiencies.

SUMMARY OF THE INVENTION

In view of the foregoing, it is an object of the present invention to provide a method for performing NMR measurements on integer spin nuclei at improved sensitivity, which has been heretofore impossible to achieve.

This object is achieved by a method for NMR measurements associated with the present invention, the measurements being high-resolution multidimensional correlation NMR measurements on integer spin nucleus S having integer spin S and other nuclei I having spin species I different from the integer spin S. This method starts with applying an RF magnetic field having a frequency that is n times (where n is an integer of 2 or more) the Larmor frequency of the integer spin nucleus S to the integer spin S. Magnetization transfer is effected between the nucleus I of the different spin species and the integer spin nucleus S.

In one feature of this method, the magnetization transfer between the nucleus I of the different spin species and the integer spin nucleus S is effected by the use of at least one or any combination of the following interactions:

(a) heteronuclear J coupling between I and S;
(b) heteronuclear residual dipolar splitting between I and S;
(c) heteronuclear dipolar coupling between I and S.

Note that an NMR signal is derived from a sample that is stationary within a static magnetic field or spun at high speed about one axis.

In another feature of the above-described method for NMR measurements, an NMR signal from the spin S is indirectly obtained through an NMR signal originated from the spin I by heteronuclear multiple quantum coherence (HMQC).

In a further feature of the above-described method for NMR measurements, an NMR signal from the spin S is indirectly obtained through an NMR signal originated from the spin I by heteronuclear single quantum coherence (HSQC).

In an additional feature of the above-described method for NMR measurements, an NMR signal from the spin S is indirectly obtained through an NMR signal originated from the spin I by heteronuclear multiple quantum coherence (HMQC) or heteronuclear single quantum coherence (HSQC). Multidimensional NMR spectroscopy is used in combination.

In a yet other feature of the above-described method for NMR measurements, the integer spin nucleus S is a quadrupolar nucleus.

In a still other feature of the above-described method for NMR measurements, the method comprises the following seven steps:

(1) exciting magnetization of the spin I using a first 90-degree pulse;
(2) converting the magnetization into heteronuclear coherence between the spins I and S during the first period $\tau$;
(3) After the first period $\tau$, RF pulses having a frequency that is n times (where n is an integer equal to or greater than 2) the Larmor frequency of the spin S are applied to the spin S. Thus, the heteronuclear coherence begins to evolve temporally while reflecting the environment of the spin S.
(4) The temporal evolution reflecting the environment of the spin I is canceled by the use of a 180-degree pulse during a period of $t_1$ and between two periods $\tau$.
(5) RF pulses having a frequency that is n times (where n is an integer equal to or greater than 2) the Larmor frequency of the spin S are applied to the spin S after the period of $t_1$, thus terminating the temporal evolution of the heteronuclear coherence which reflects the environment of the spin S.
(6) During the second period $\tau$, the heteronuclear coherence is converted into magnetization of the spin I.
(7) During a period of $t_2$, the magnetization of the spin I reflecting the environment of the spin S is detected.

In one feature of this method, the integer spin nucleus S is a quadrupolar nucleus.

Additionally, this method can comprise the following six steps:

(1) Magnetization of the spin I is excited by a first 90-degree pulse.
(2) The magnetization is converted into heteronuclear coherence between the different nuclear species, i.e., the spins I and S, during the first period T.
(3) After the first period $\tau$, RF pulses having a frequency that is n times (where n is an integer equal to or greater than 2) the Larmor frequency of the spin S are applied to the spin S. Thus, the heteronuclear coherence begins to evolve temporally while reflecting the environment of the spin S. At the same timing, a 90-degree pulse is applied to the spin I to thereby convert a magnetization signal from the spin I into vertical magnetization.
(4) The temporal evolution of the heteronuclear coherence which reflects the environment of the spin S is terminated by application of RF pulses to the spin S after a period of $t_1$, the RF pulses having a frequency that is n times (where n is an integer equal to or greater than 2) the Larmor frequency of the spin S. At the same timing, a 90-degree pulse is applied to the spin I to convert the magnetization signal from the spin I back to lateral magnetization.
(5) During the second period $\tau$, the heteronuclear coherence is converted into magnetization of the spin I.
(6) During a period of $t_2$, magnetization of the spin I reflecting the environment of the spin S is detected.

In one feature of this method, the integer spin nucleus S is a quadrupolar nucleus.

The method for NMR measurements according to the present invention is used to perform high-resolution multidimensional correlation NMR on integer spin nucleus S and nucleus I of a nuclear spin species different from the integer spin nucleus S. An RF magnetic field having a frequency that is n times (where n is an integer equal to or greater than 2) as high as the Larmor frequency of the integer spin nucleus S is applied to the integer spin S. Magnetization transfer is effected between the nucleus I of the other nuclear spin species and the integer spin S. Consequently, high-resolution multidimensional correlation NMR is performed. Hence, integer spin nucleus NMR measurements can be made with high sensitivity that has not been achieved heretofore.

BRIEF DESCRIPTION OF THE DRAWINGS

FIG. 5 further illustrates the conventional method illustrated in FIG. 4.

DESCRIPTION OF THE PREFERRED EMBODIMENTS

The preferred embodiments of the present invention are hereinafter described with reference to the drawings. In the present invention, at least one overtone excitation is applied to integer spin S to excite two quantum transitions. The excited transitions are observed. A multidimensional NMR measurement of correlation with other different nuclear species I is performed. The excitation of the two quantum transitions using the overtone excitation suppresses first-order quadrupolar powder pattern. The NMR detection sensitivity is improved by (i) using spin I for initial magnetization, (ii) observing the spin I, or (iii) using both simultaneously. Generally, integer spin nuclei S described below are all quadrupolar nuclei.

Embodiment 1

This is a normal heteronuclear multiple quantum coherence (HMQC) measurement in which irradiation of spin S is replaced by overtone irradiation.

First, heteronuclear multiple quantum coherence (HMQC) is described briefly. Where there are two different nuclear species I and S, HMQC is a technique for indirectly measuring an NMR signal of the nucleus S through the nucleus I. In most cases, the signal of the nucleus S of lower sensitivity is observed via the nucleus I of higher sensitivity. Consequently, the NMR detection sensitivity is improved.

The principle of measurement is as follows. First, a magnetization signal of the nucleus I is shifted to the nucleus S. An NMR signal of the nucleus S is recorded. Then, the magnetization signal is shifted again to the nucleus I and an NMR spectrum is recorded. During recording of the NMR signal of the nucleus S, the magnetization signal of the nucleus I is lateral magnetization.

Figure 1:
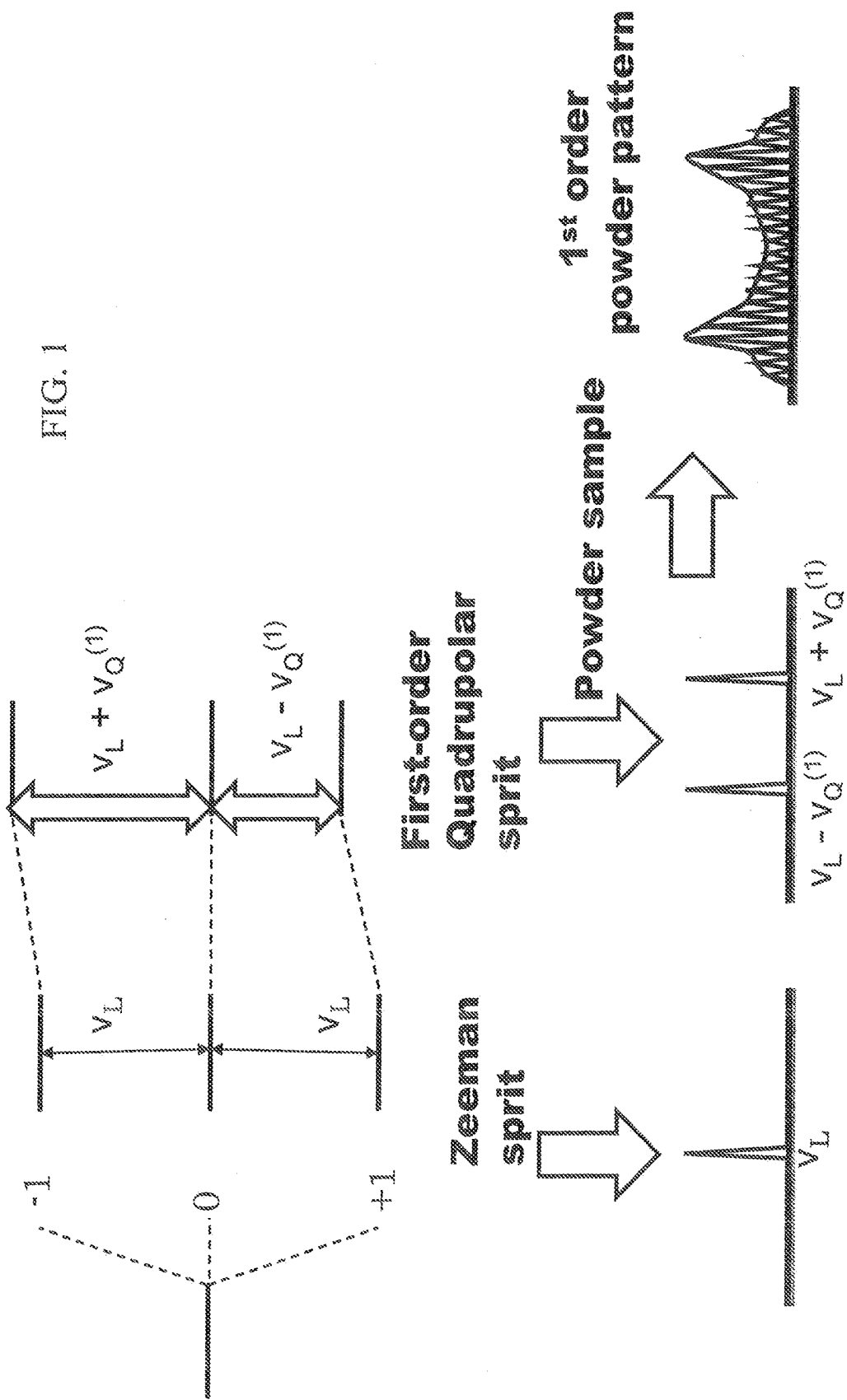
FIG. 1 illustrates a conventional method for NMR measurements on integer spin nuclei.
Figure 2:
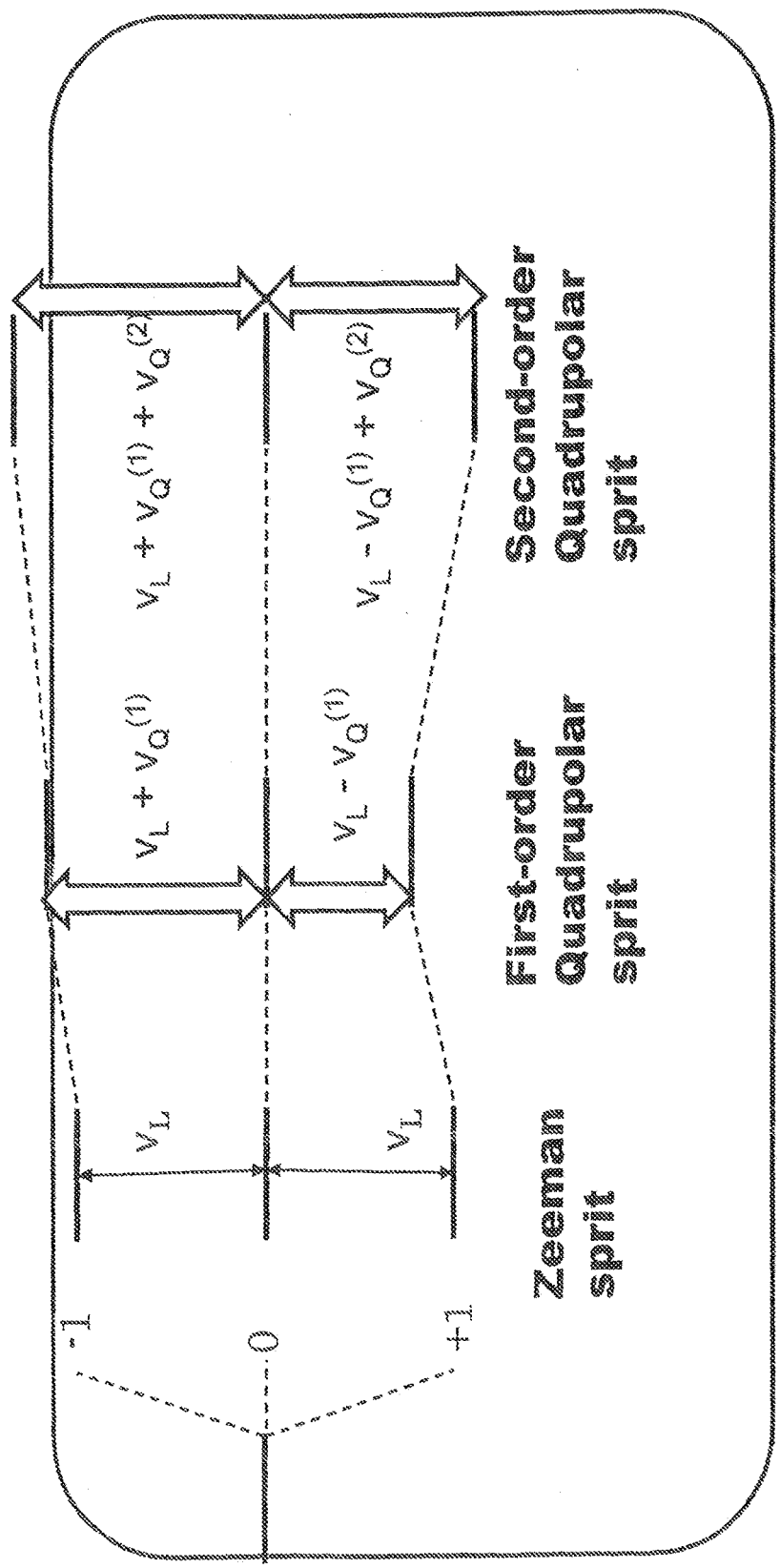
FIG. 2 further illustrates the conventional method illustrated in FIG. 1.
Figure 3:
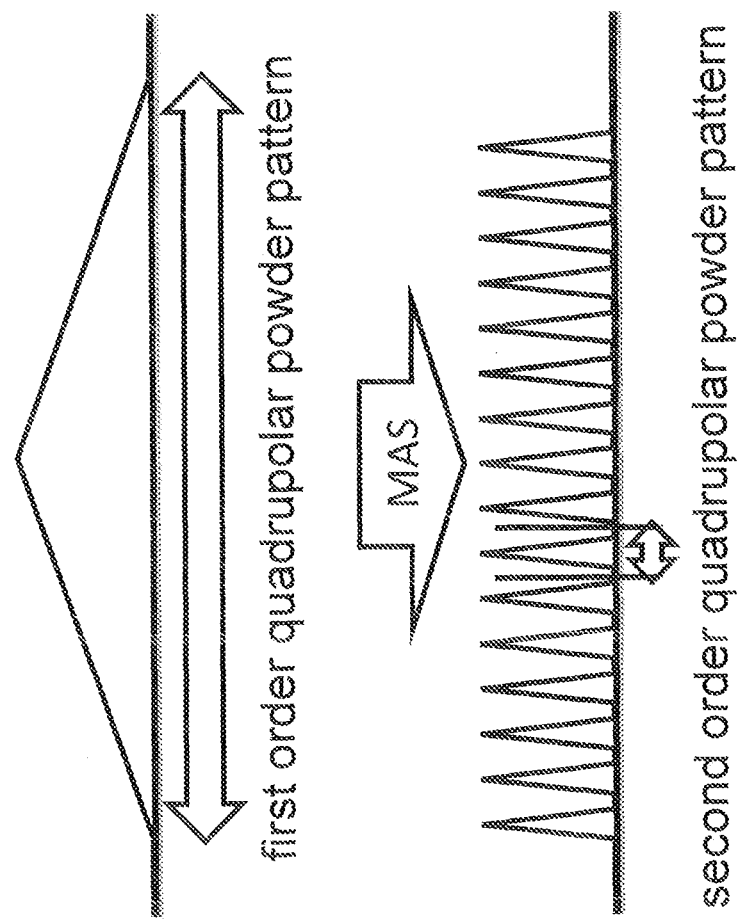
FIG. 3 further illustrates the conventional method illustrated in FIG. 1.
Figure 4:
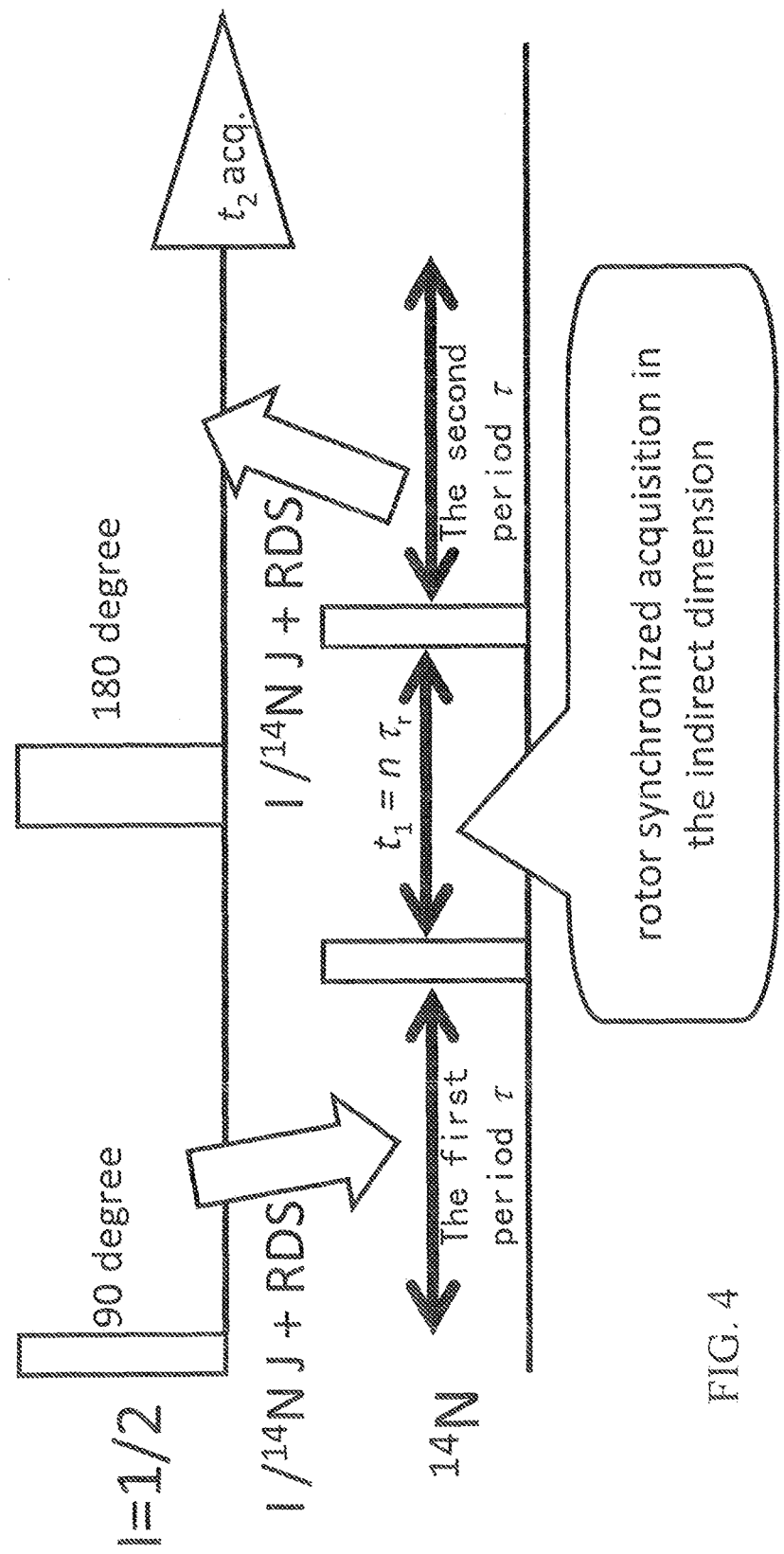
FIG. 4 illustrates another conventional method for NMR measurements on integer spin nuclei.
Figure 6:
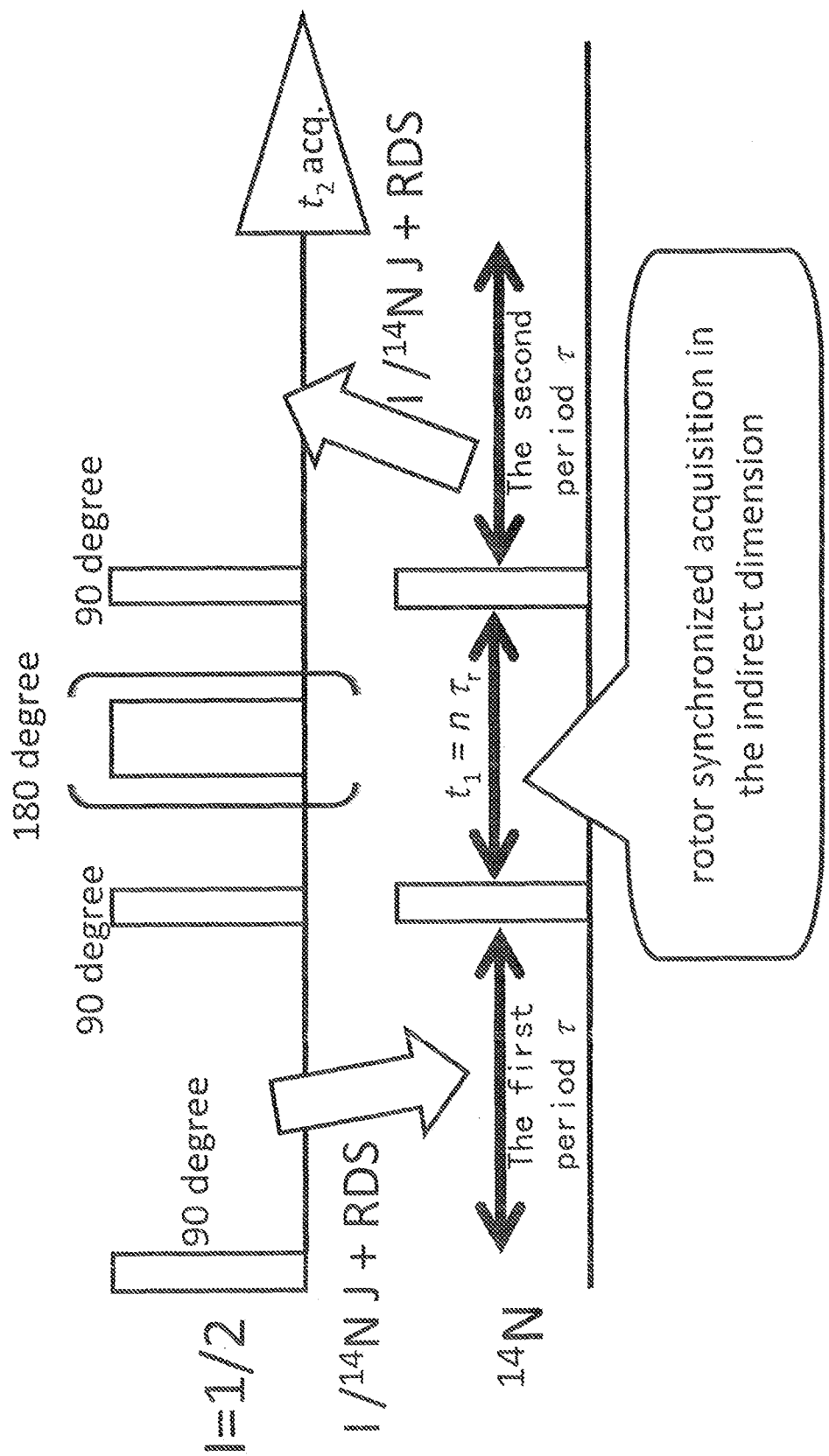
FIG. 6 illustrates a further conventional method for NMR measurements on integer spin nuclei.
Figure 7:
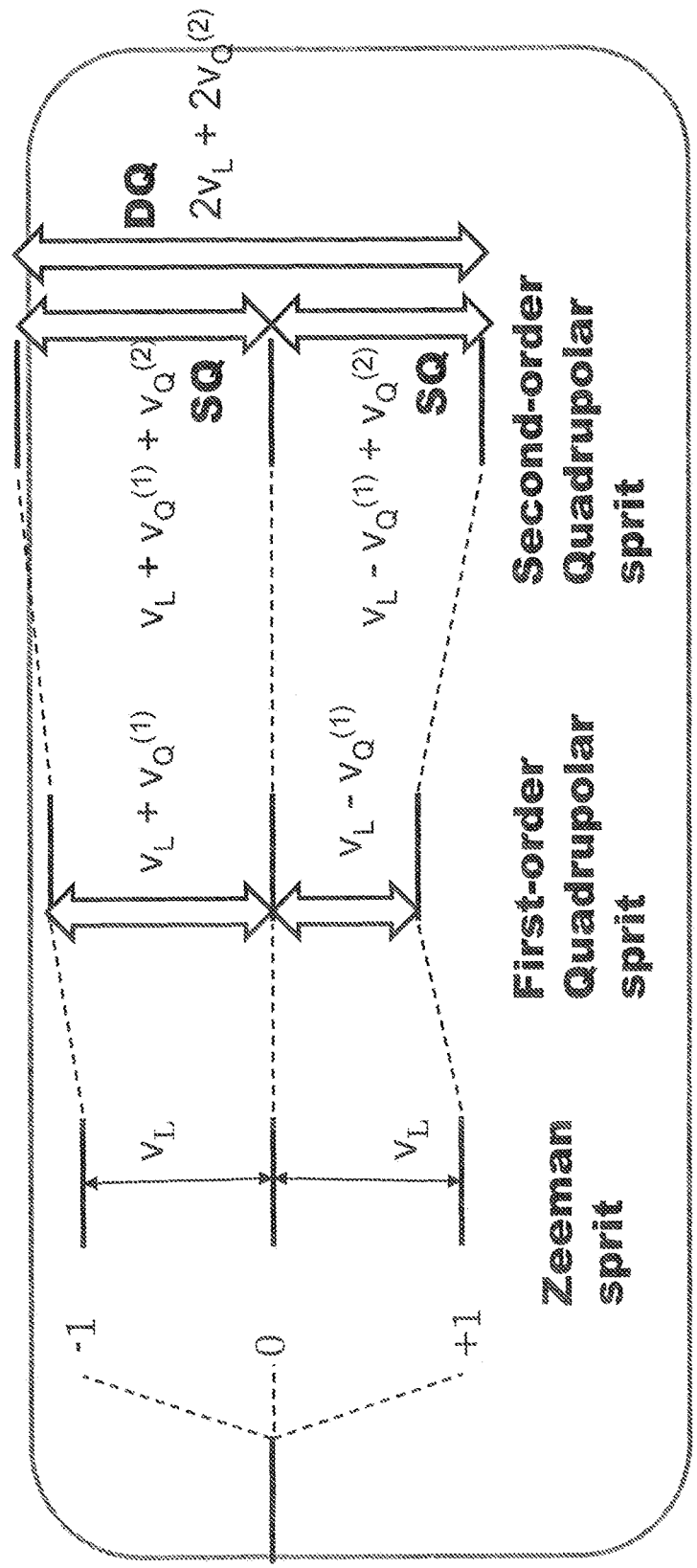
FIG. 7 illustrates a still other conventional method for NMR measurements on integer spin nuclei.
Figure 8:
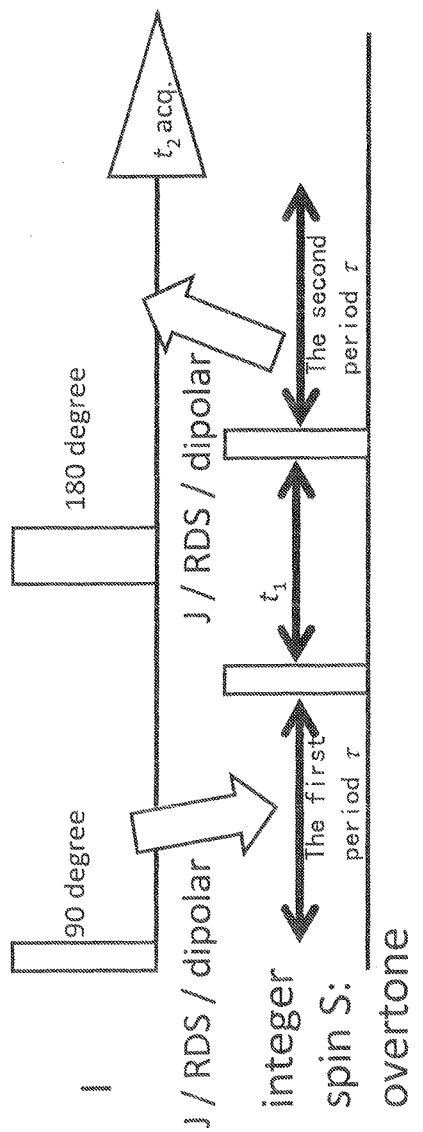
FIG. 8 illustrates one method for NMR measurements on integer spin nuclei, the method being according to the present invention.

In the present embodiment, such HMQC is used. Overtone excitation of $^{14}N$ nucleus is performed, and an observation is made. A pulse sequence for this purpose is illustrated in FIG. 8. The pulse sequence is described below.

(1) A first 90-degree pulse excites magnetization of spin I.

(2) The magnetization is converted into coherence between different nuclear species, i.e., spins I and S, during the first period τ. For this conversion, one of J coupling between the spins I and S, residual dipolar splitting (RDS), and dipolar coupling or any combination of them is used. For this purpose, no pulse needs to be applied during the period τ. However, the conversion can be carried out more positively by application of a pulse. For example, the conversion can be carried out more efficiently by applying a pulse for restoring the dipolar interaction between the spins I and S.

(3) An overtone pulse is applied to the spin S after the first period τ. This starts the coherence between the different nuclear species evolving temporally while reflecting the environment of the spin S.

(4) A 180-degree pulse cancels the temporal evolution reflecting the environment of the spin I during a period of $t_1$ and between two periods T.

(5) An overtone pulse of the spin S is applied after the period $t_1$. This terminates the temporal evolution of the coherence between the different nuclear species, the evolution reflecting the environment of the spin S.

(6) During the second period τ, the heteronuclear coherence is converted to magnetization of the spin I.

(7) During a period of $t_2$, the magnetization of the spin I reflecting the environment of the spin S is observed. A signal of the spin S is indirectly detected via the spin I.

The use of this pulse sequence permits improvement of the sensitivity because the spins I of higher sensitivity than the spin S are initially magnetized and because the spin I of higher sensitivity than the spin S is observed.

Furthermore, the use of double quantum coherence making use of overtone excitation can suppress first-order quadrupolar powder pattern. When the vertical magnetization relaxation time of the spin I is shorter than the vertical magnetization relaxation time of the spin S, a decrease in the observation time can be accomplished. The operation of the present embodiment is described below.

(1) Single quantum coherence ($I^{(\pm 1)}$) of the spin I is excited, where the superscript indicates the order of the coherence.

(2) During the first period τ, magnetization ($I^{(\pm 1)} S^{(0)}$) between the spins I and S is generated using one or any combination of heteronuclear J coupling, heteronuclear residual dipolar splitting, and heteronuclear dipolar coupling.

(3) Overtone excitation is applied to the spin S to convert the magnetization of the spin S into double quantum coherence ($I^{(\pm 1)} S^{(\pm 2)}$).

(4) During the period $t_1$, the double quantum coherence ($I^{(\pm 1)} S^{(\pm 2)}$) is made to evolve temporally. The temporal evolution of the single quantum coherence ($I^{(\pm 1)}$) is canceled by a 180-degree pulse applied to the spin I. Only the temporal evolution of $S^{(\pm 2)}$ is recorded.

(5) The double quantum coherence $I^{(\pm 1)} S^{(\pm 2)}$ that has been evolved temporally is converted into $I^{(\pm 1)} S^{(0)}$ by overtone irradiation of the spin S.

(6) During the second period τ, the double quantum coherence is converted into single quantum coherence ($I^{(\pm 1)}$) of the spin I using one or any combination of heteronuclear J coupling, heteronuclear residual dipolar splitting, and heteronuclear dipolar coupling. A signal of the spin I is observed at the time $t_2$. The results of a measurement performed according to the present embodiment are given below.

Figure 9:
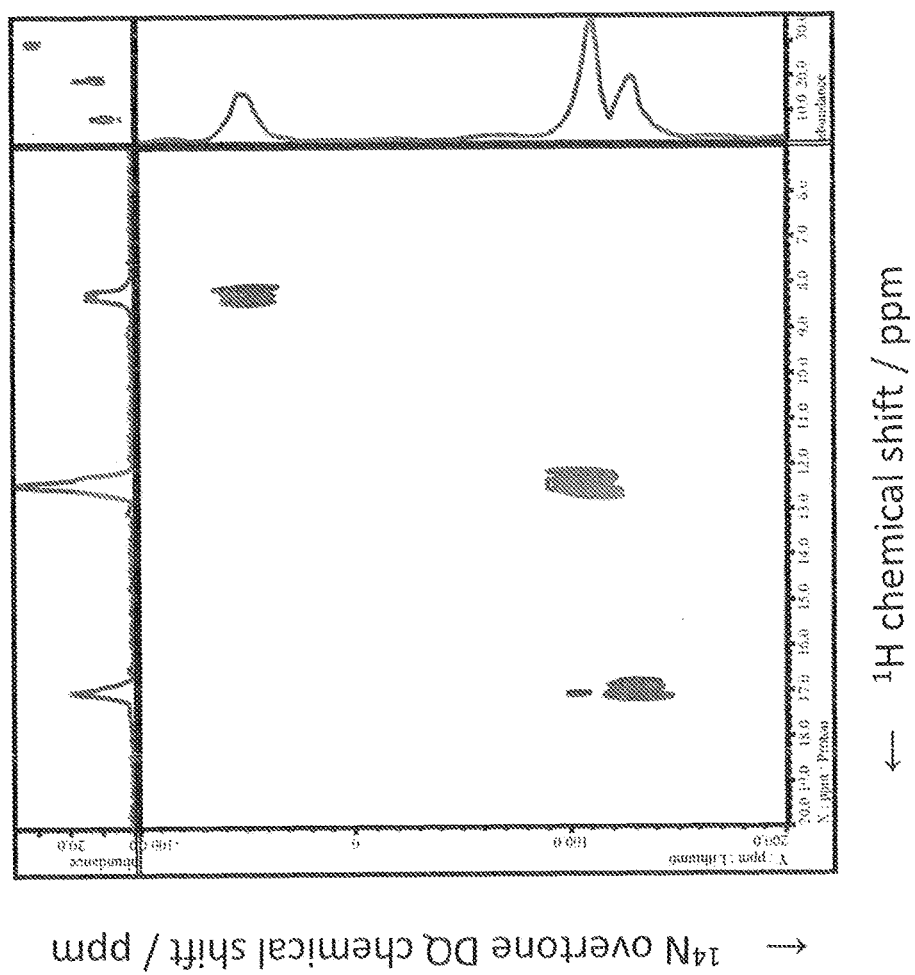
FIG. 9 shows NMR data obtained by a method for NMR measurements on integer spin nuclei, the method being according to the invention.

Overtone heteronuclear multiple quantum coherence (HMQC) spectroscopy was applied to L-histidine, and a $^1H/^{14}N$ measurement was performed. This is illustrated in FIG. 9. At this time, $I=^1H$ and $S=^{14}N$. $^{14}N$ nucleus was irradiated with an overtone frequency that was double the Larmor frequency of $^{14}N$ nucleus, and then HMQC was measured. Correlation between the double quantum coherence of $^{14}N$ nucleus excited by the overtone irradiation and $^1H$ nucleus was obtained.

Embodiment 2

This is a heteronuclear single quantum coherence (HSQC) measurement in which irradiation of the spin S has been replaced by overtone irradiation. First, HSCQ is described briefly. HSQC is a technique for indirectly observing a magnetization signal of the nucleus S via the nucleus I in the same way as for HMQC of embodiment 1. However, the difference is that the magnetization signal from the nucleus I is converted into vertical magnetization while an NMR signal from the nucleus S is being recorded. It can be expected that the NMR signal from the nucleus S will be detected at higher resolution than in the case of HMQC.

Figure 10:
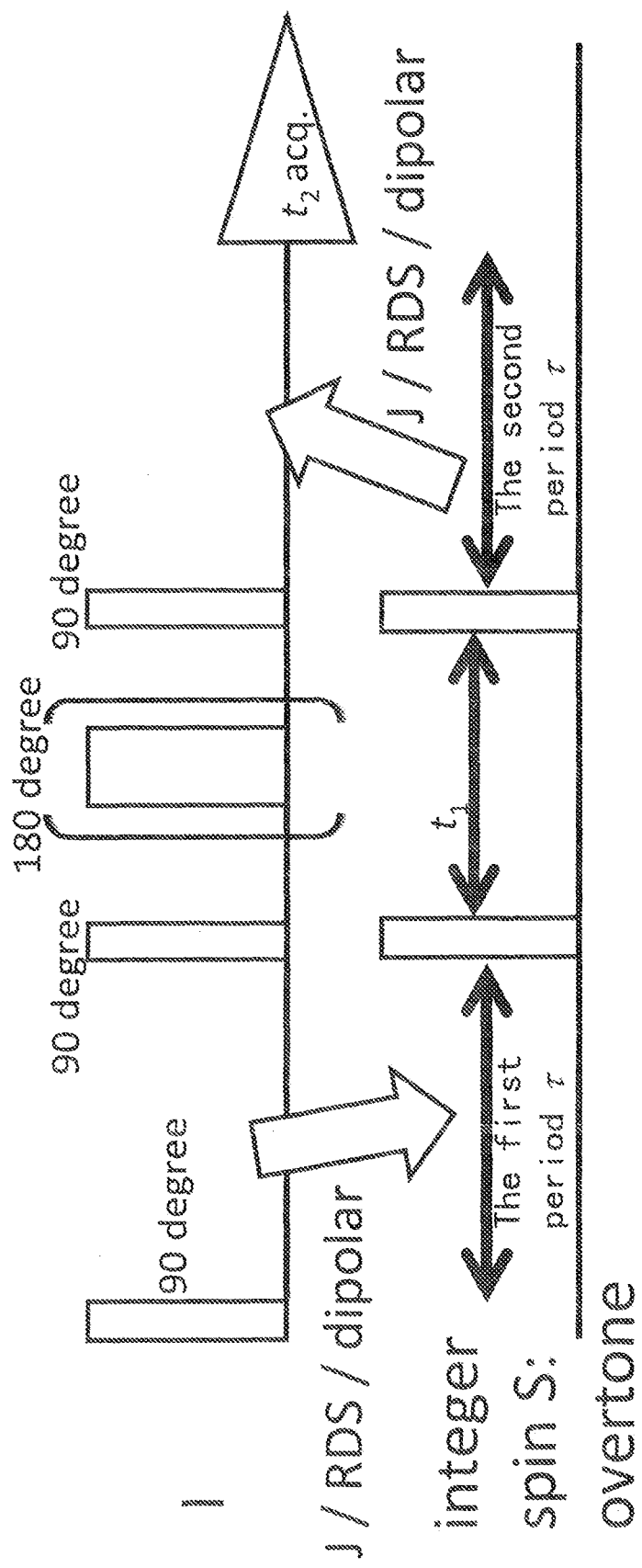
FIG. 10 illustrates another method for NMR measurements on integer spin nuclei, the method being according to the present invention.

In the present embodiment, such HSQC is used. $^{14}N$ nucleus is subjected to overtone irradiation and observed. A pulse sequence for this purpose is illustrated in FIG. 10. The pulse sequence is described now.

(1) A first 90-degree pulse is applied to excite magnetization of spin I.

(2) The magnetization is converted into coherence between different nuclear species, i.e., spins I and S, during the first period τ. For the conversion, any one of J coupling between the spins I and S, residual dipolar splitting (RDS), and dipolar coupling or any combination of them is used. For this conversion, no pulse needs to be applied during the first period τ. However, if a pulse is applied, the conversion can be performed more positively. For instance, the conversion can be performed more efficiently by applying a pulse to restore the dipolar interaction between the spins I and S.

(3) An overtone pulse is applied to the spin S after the first period τ to start temporal evolution of heteronuclear coherence that reflects the environment of the spin S. A magnetization signal from the spin I is converted into vertical magnetization by applying a 90-degree pulse to the spin I at the same timing as the overtone pulse.

(4) A 180-degree pulse cancels the temporal evolution during the period $t_1$ and between two periods τ, the evolution reflecting the environment of the spin I. This 180-degree pulse is not essential.

(5) An overtone pulse of the spin S applied after the period $t_1$ ceases the temporal evolution of the heteronuclear coherence reflecting the environment of the spin S. A 90-degree pulse is applied to the spin I at the same timing as the overtone pulse to return the magnetization signal from the spin I to lateral magnetization.

(6) During the second period τ, the heteronuclear coherence is converted into magnetization of the spin I.

(7) During a period of $t_2$, magnetization of the spin I reflecting the environment of the spin S is observed, and a signal from the spin S is indirectly detected via the spin I.

The use of this pulse sequence permits improvement of the sensitivity because the spin I of higher sensitivity than the spin S is initially magnetized and because the spin I of higher sensitivity than the spin S is observed.

Furthermore, first-order quadrupolar powder pattern can be suppressed by using double quantum coherence utilizing overtone irradiation. In addition, where the vertical magnetization relaxation time of the spin I is shorter than the vertical magnetization relaxation time of the spin S, a decrease in the NMR observation time can be accomplished. The operation of the present embodiment is described below.

(1) Single quantum coherence ($I^{(\pm 1)}$) of the spin I is excited, where the superscript indicates the order of the coherence.

(2) During the first period τ, magnetization ($I^{(\pm 1)} S^{(0)}$) between the spins I and S is generated using one or any combination of heteronuclear J coupling, heteronuclear residual dipolar splitting, and heteronuclear dipolar coupling.

(3) Overtone excitation is applied to the spin S and excitation is applied to the spin I to convert the magnetization of the spin S into double quantum coherence ($I^{(\pm 1)} S^{(\pm 2)}$).

(4) During the period $t_1$, the double quantum coherence ($I^{(0)} S^{(\pm 2)}$) is evolved temporally. The temporal evolution of the single quantum coherence ($I^{(\pm 1)}$) is canceled by a 180-degree pulse applied to the spin I. Since $I^{(0)}$ does not evolve in time, only the temporal evolution of $S^{(\pm 2)}$ is recorded. In order to reduce the effects of the interaction between the spins I and S (i.e., to decouple the interaction), a 180-degree pulse can be applied to the spin I.

(5) The double quantum coherence $I^{(0)} S^{(\pm 2)}$ that has been evolved temporally is converted into $I^{(\pm 1)} S^{(0)}$ by overtone irradiation of the spin S and irradiation of the spin I.

(6) During the second period τ, the double quantum coherence is converted into single quantum coherence $I^{(\pm 1)}$ of the spin I using one or any combination of heteronuclear J coupling, heteronuclear residual dipolar splitting, and heteronuclear dipolar coupling. A signal of the spin I is observed at the time $t_2$.

Embodiment 3

Figure 11:
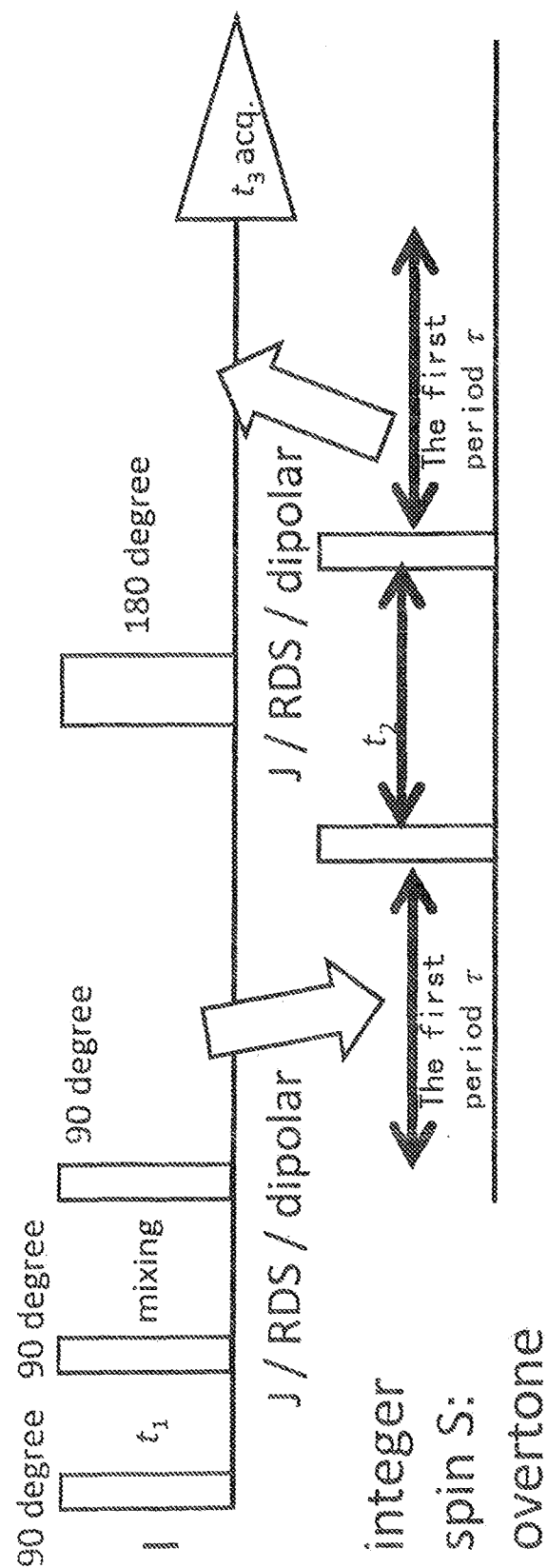
FIG. 11 illustrates a further method for NMR measurements on integer spin nuclei, the method being according to the present invention.

The present embodiment is an example of combination of heteronuclear multiple quantum coherence (HMQC) and other multidimensional NMR method. It is easy to combine embodiment 1 and other multidimensional NMR method. As one example, an example of combination of HMQC and a measurement of exchange of magnetization with spin I is shown in FIG. 11. Note that such combinations are infinite in number and that the following example is merely one example. The following six advantageous effects can be obtained from the embodiments described so far.

(1) Double quantum coherence is excited and observed by applying overtone excitation to the integer spin S and, therefore, odd orders (first order, third order, and so on) of quadrupolar powder pattern can be removed from a spectrum of the spin S. This leads to an improvement of the resolution.

(2) The sensitivity is improved by using magnetization of the spin I of higher sensitivity than the spin S for initial magnetization.

(3) The sensitivity is improved by observing the spin I of higher sensitivity than the spin S.

(4) The process becomes more tolerant to deviation of the setting of the magic angle by employing double quantum coherence of integer spin S.

(5) The period $t_1$ in which an observation is made can be set at will by utilizing double quantum coherence of the integer spin S.

(6) Where the spin I is shorter in vertical magnetization relaxation time than the spin S, the number of measurements per unit time can be increased. This results in an improvement of sensitivity per unit time.

The present invention can be widely applied to high-sensitivity NMR measurements of integer spin nuclei.

Having thus described our invention with the detail and particularity required by the Patent Laws, what is desired protected by Letters Patent is set forth in the following claims.

The invention claimed is:

1. A method of performing high-resolution multidimensional correlation NMR measurements on integer spin nucleus S having integer spin S and other nucleus I having a spin species I different from the integer spin S, wherein said method comprises the steps of:
   (1) exciting magnetization of the spin I within a sample by applying, with an NMR spectrometer, a first 90-degree RF pulse having a frequency that is n times (where n is an integer equal to or greater than 2) the Larmor frequency of the integer spin nucleus S to the integer spin S and thereby effecting a magnetization transfer between the nucleus I of the different spin species and the integer spin S;
   (2) converting the excited magnetization into heteronuclear coherence between the spins I and S during a period of T by utilizing at least one of the following (a) through (c) interactions, or a combination thereof:
      (a) heteronuclear J coupling between I and S;
      (b) heteronuclear residual dipolar splitting between I and S; and
      (c) heteronuclear dipolar coupling between I and S, and wherein an NMR signal is derived from the sample, with the sample being either stationary within a static magnetic field, or spun at high speed about one axis;
   (3) applying with the NMR spectrometer, an overtone RF pulse having a frequency that is n times (where n is an integer equal to or greater than 2) the Larmor frequency of the integer spin nucleus S to the integer spin S after the period of T in order to start a temporal evolution of the heteronuclear coherence while reflecting the environment of the integer spin S;

(4) canceling the temporal evolution reflecting the environment of the spin I during a period $t_1$ and between two periods L by the use of an applied 180-degree RF pulse also provided by the NMR spectrometer;

(5) applying with the NMR spectrometer, another overtone RF pulse having a frequency that is n times (where n is an integer equal to or greater than 2) the Larmor frequency of the integer spin nucleus S to the integer spin S after the period of $t_1$, thus terminating the temporal evolution of the heteronuclear coherence which reflects the environment of the integer spin S;

(6) converting the heteronuclear coherence into magnetization of the spin I during the second period of T by again using of at least one of the interactions, or the combination of interactions, from step (2); and (7) detecting, recording, and providing high-resolution multidimensional correlation NMR measurements, of the spin I reflecting the environment of the integer spin S, with the NMR spectrometer, during a period of t2.

2. A method of performing high-resolution multidimensional correlation NMR measurements as set forth in claim 1, wherein an NMR signal from the integer spin nucleus S is indirectly obtained through an NMR signal originated from the spin I by heteronuclear multiple quantum coherence (HMQC).

3. A method of performing high-resolution multidimensional correlation NMR measurements as set forth in claim 1, wherein an NMR signal from the integer spin nucleus S is indirectly obtained through an NMR signal originated from the spin I by heteronuclear single quantum coherence (HSQC).

4. A method of performing high-resolution multidimensional correlation NMR measurements as set forth in claim 2, combined with double quantum coherence NMR spectroscopy.

5. A method of performing high-resolution multidimensional correlation NMR measurements as set forth in claim 3, combined with double quantum coherence NMR spectroscopy.

6. A method of performing high-resolution multidimensional correlation NMR measurements as set forth in claim 1 wherein said integer spin nucleus S is a quadrupolar nucleus.

7. A method of performing high-resolution multidimensional correlation NMR measurements as set forth in claim 2, wherein said integer spin nucleus S is a quadrupolar nucleus.

8. A method of performing high-resolution multidimensional correlation NMR measurements as set forth in claim 3, wherein said integer spin nucleus S is a quadrupolar nucleus.

9. A method of performing high-resolution multidimensional correlation NMR measurements as set forth in claim 4 wherein said integer spin nucleus S is a quadrupolar nucleus.

10. A method of performing high-resolution multidimensional correlation NMR measurements on integer spin nucleus S having integer spin S and other nucleus I having a spin species I different from the integer spin S, wherein said method comprises the steps of:

(1) exciting magnetization of the spin I within a sample by applying, with an NMR spectrometer, a first 90-degree RF pulse having a frequency that is n times (where n is an integer equal to or greater than 2) the Larmor frequency of the integer spin nucleus S to the integer spin S and thereby effecting a magnetization transfer between the nucleus I of the different spin species and the integer spin S;

(2) converting the excited magnetization into heteronuclear coherence between the spins I and S during a period of T by utilizing at least one of the following (a) through (c) interactions, or a combination thereof:

(a) heteronuclear J coupling between I and S;

(b) heteronuclear residual dipolar splitting between I and S; and (c) heteronuclear dipolar coupling between I and S, and wherein an NMR signal is derived from the sample, with the sample being either stationary within a static magnetic field, or spun at high speed about one axis;

(3) starting temporal evolution of the heteronuclear coherence which reflects the environment of the spin S by applying with the NMR spectrometer, additional RF pulses having a frequency n times (where n is an integer equal to or greater than 2) the Larmor frequency of the integer spin nucleus S to the integer spin S after the period of T and converting a lateral magnetization signal from the spin I into vertical magnetization by applying with the NMR spectrometer a 90-degree RF pulse to the spin I at the same time as the overtone RF pulse;

(4) terminating the temporal evolution of the heteronuclear coherence which reflects the environment of the spin S by applying with the NMR spectrometer, additional RF pulses having a frequency n times (where n is an integer equal to or greater than 2) the Larmor frequency of the integer spin nucleus S to the integer spin S after a period of t1 and applying with the NMR spectrometer a 90-degree RF pulse to the spin I at the same time as the overtone RF pulse in order to convert the vertical magnetization signal from the spin I back into lateral magnetization;

(5) converting the heteronuclear coherence into magnetization of the spin I during the second period of T by repeating the use of at least one of the interactions or the combination of interactions from step 2; and (6) detecting, recording, and providing high-resolution multidimensional correlation NMR measurements, of the spin I reflecting the environment of the integer spin S, with the NMR spectrometer, during a period of t2.

11. A method of performing high-resolution multidimensional correlation NMR measurements as set forth in claim 10 wherein said integer spin nucleus S is a quadrupolar nucleus.

* * * * *